US009324426B2

(12) United States Patent
Jang et al.

(10) Patent No.: US 9,324,426 B2
(45) Date of Patent: Apr. 26, 2016

(54) METHOD FOR IMPROVING SENSING MARGIN OF RESISTIVE MEMORY

(71) Applicant: Integrated Silicon Solution, Inc., Milpitas, CA (US)

(72) Inventors: Seong Jun Jang, Milpitas, CA (US); Justin Kim, Seongnam (KR); Geun-Young Park, Milpitas, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

(21) Appl. No.: 14/293,982

(22) Filed: Jun. 2, 2014

(65) Prior Publication Data

US 2015/0348624 A1 Dec. 3, 2015

(51) Int. Cl.
*G11C 11/00* (2006.01)
*G11C 13/00* (2006.01)

(52) U.S. Cl.
CPC .......... *G11C 13/004* (2013.01); *G11C 13/0069* (2013.01); *G11C 2013/0042* (2013.01)

(58) Field of Classification Search
USPC .................................. 365/148, 200, 205, 207
See application file for complete search history.

(56) References Cited

U.S. PATENT DOCUMENTS

| 7,539,050 | B2 | 5/2009 | Philipp et al. | |
|---|---|---|---|---|
| 8,045,361 | B2 | 10/2011 | Lee et al. | |
| 8,351,245 | B2 | 1/2013 | Ma et al. | |
| 8,559,253 | B2 | 10/2013 | Kitagawa et al. | |
| 2008/0049487 | A1* | 2/2008 | Yoshimura et al. | 365/148 |
| 2008/0316798 | A1* | 12/2008 | Tanizaki et al. | 365/148 |
| 2010/0188877 | A1* | 7/2010 | Hanzawa et al. | 365/63 |
| 2012/0069625 | A1* | 3/2012 | Wada | G11C 11/5685 365/148 |
| 2012/0314478 | A1 | 12/2012 | Ha et al. | |
| 2013/0235648 | A1 | 9/2013 | Kim et al. | |
| 2013/0279243 | A1 | 10/2013 | Huang | |
| 2014/0040535 | A1* | 2/2014 | Lee et al. | 711/103 |
| 2014/0092670 | A1 | 4/2014 | Cosemans | |
| 2014/0098592 | A1 | 4/2014 | Lee | |
| 2015/0070970 | A1* | 3/2015 | Inaba et al. | 365/148 |

* cited by examiner

*Primary Examiner* — Hoai V Ho
(74) *Attorney, Agent, or Firm* — Van Pelt, Yi & James LLP

(57) ABSTRACT

A method in a resistive memory device includes configuring two or more memory cells in a column of the array sharing the same bit line and the same source line to operate in parallel as a merged memory cell; programming the resistance of the merged memory cell in response to the write data, the resistance of the two or more resistive memory cells in the merged memory cell being programmed simultaneously; and reading the programmed resistance value of the merged memory cell, the programmed resistance of the two or more memory cells in the merged memory cell being read simultaneously.

19 Claims, 6 Drawing Sheets

(a)

(b)

METHOD FOR IMPROVING SENSING MARGIN OF RESISTIVE MEMORY

BACKGROUND OF THE INVENTION

Resistive random-access memory (RRAM or "resistive memory") is a type of non-volatile memory where the data storage function is implemented in a variable resistance element whose resistance value can change between a low level and a high level. For example, most resistive memory devices include as the variable resistance element a controllable resistor material between upper and lower conductive electrodes. The controllable resistor material may be a transition metal oxide or other suitable materials. A conductive path is created or dissolved in the controllable resistor material, corresponding to low-resistive and high-resistive states. A resistive memory cell in a resistive memory device typically includes a variable-resistance resistive memory element connected serially with a switching device acting as a cell selector. The switching device is typically an NMOS transistor.

In some examples, a resistive memory cell can store a logical "0" value by programming the resistive memory element to have a relatively large resistance ($R_{RESET}$). The resistive memory cell can store a logical "1" value by programming the resistive memory element to have a relatively small resistance ($R_{SET}$). However, due to limitations in the fabrication process, the resistance values for the high and low resistance levels are often distributed over a range. Furthermore, the resistance values for the high and low resistance levels often vary over time.

Resistive memory devices have advantages over existing memory devices, such as DRAM, for their low operating current, fast access time, and long data retention. Furthermore, resistive memory devices are attractive as replacement for existing memory devices because of their compatibility with existing CMOS fabrication technologies.

BRIEF DESCRIPTION OF THE DRAWINGS

Various embodiments of the invention are disclosed in the following detailed description and the accompanying drawings.

FIGS. 5(a) and 5(b), illustrates the cell current distribution of a single resistive memory cell and a merged resistive memory cell in a resistive memory device in some examples.

DETAILED DESCRIPTION

Figure 1:
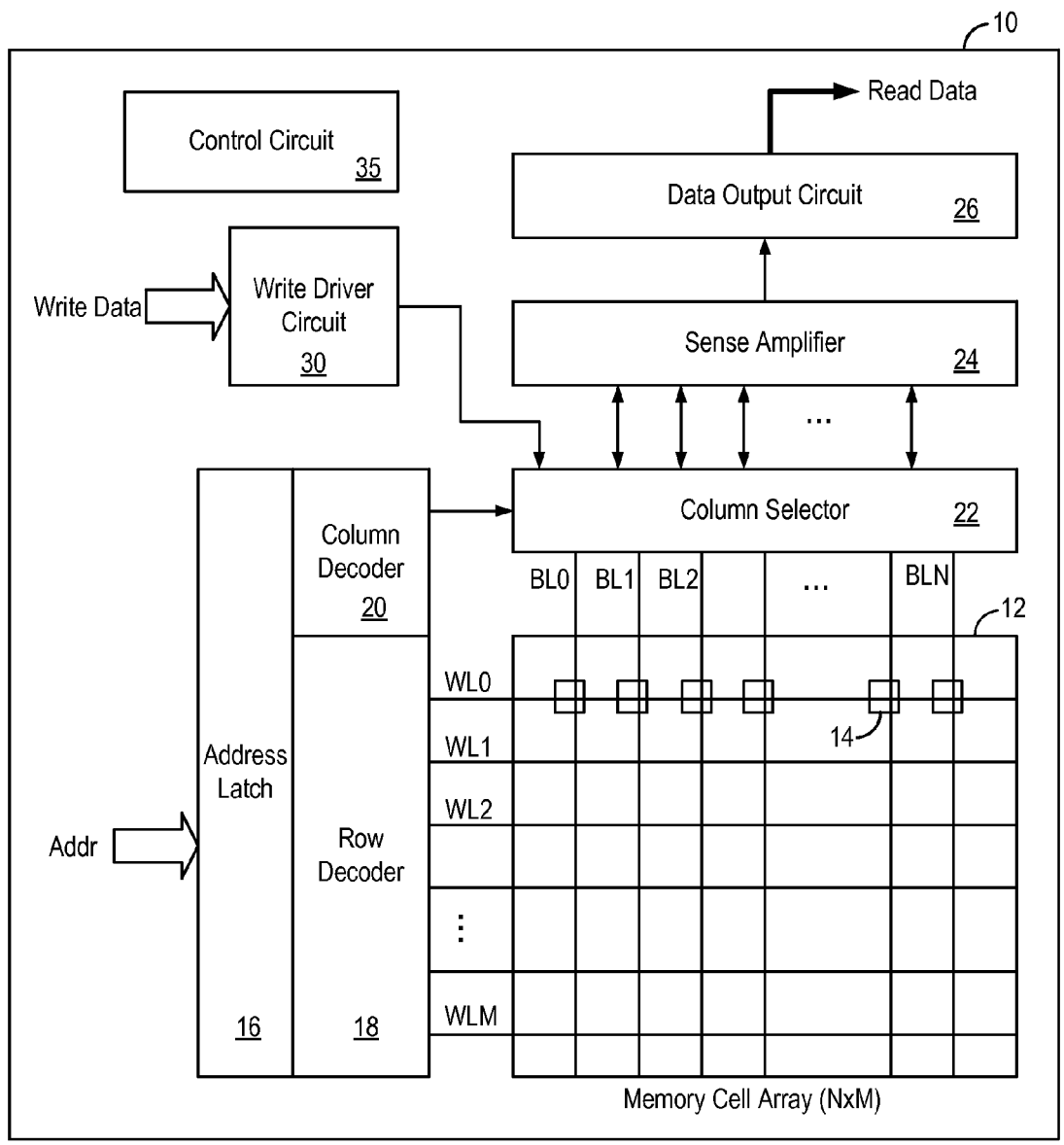
FIG. 1 is a block diagram of a resistive memory device in one exemplary embodiment.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a resistive memory device implements parallel merging of two or more resistive memory cells in operation to increase the sense margin of stored data for the read-out operation. When two resistive memory cells are merged in parallel in operation, the variable cell resistance is reduced and the cell current difference between the high and low logical states is increased. The sense margin between the high and low logical states of the resistive memory cell is therefore increased to ensure accurate detection of the high and low logical states.

In some embodiments, two or more resistive memory cells in the memory array are merged in parallel by enabling multiple word lines during the write and read operations of the resistive memory device. In one embodiment, one or more bits of the row address (X-address) are ignored at the row decoder so that multiple word lines are enabled during write and read operations.

The memory cell parallel merging scheme of the present invention is particular advantageous when the resistive memory device is fabricated using an existing memory fabrication process. For example, the resistive memory device may be fabricated as a DRAM process replacement, using existing DRAM process technology with the resistive memory element (resistor) replacing the capacitive storage element (capacitor) in the DRAM cell. When an existing DRAM fabrication process is used to manufacture a resistive memory device, the DRAM fabrication process may limit the ability of the resistive memory cells to achieve certain desired resistance values. Thus, when the resistive memory device is fabricated as a process replacement, the resistive memory cell may not be able to achieve the desired sense margin between the logical high state and the logical low state. In those cases, the memory cell parallel merging scheme of the present invention can be advantageously applied to increase the sense margin of the resistive memory device thus fabricated, enabling ease of manufacturing while also improving the operational characteristics of the resistive memory device.

In some embodiments, the memory cell parallel merging scheme of the present invention is applied in a resistive memory device only for memory cells that demand a lower error rate, such as memory cells storing error correction code (ECC) data bits. In other embodiments, the memory cell parallel merging scheme of the present invention is applied to use with redundant memory cells where the redundant memory cells are merged with malfunctioning memory cells, such as memory cells whose resistance values have deviated so much that the high-low resistance values are not within the sense range of the resistive memory device.

FIG. 1 is a block diagram of a resistive memory device in one exemplary embodiment. FIG. 1 is illustrative only and the resistive memory device may include additional components not shown in FIG. 1. Referring to FIG. 1, the resistive memory device 10 includes a two-dimensional array 12 of resistive memory cells 14. The cell array 12 is addressed by a row decoder 18 and a column decoder 20 to selectively access the resistive memory cells 14 for read and write operations. In some cases, a refresh operation may be performed to preserve the stored data. In particular, an address Addr is received at an address latch 16 and the received address is decoded by the row decoder 18 which selects the word lines and the column decoder 20 which selects the bit lines of the memory array 12. The resistor memory cells 14 in the array 12 are accessed by word lines WL0 to WLM and bit lines BL0 and BLN. In conventional operation, the row decoder 18 selectively activates a word line from WL0 to WLM. The column decoder selectively activates a bit line from BL0 to BLN through the column selector circuit 22 to allow a resistive memory cell 14 at the intersection of the selected word line and selected bit line to be accessed.

To read data from the memory array 12, the column selector circuit 22 connects the bit lines to a sense amplifier circuit 24. The sense amplifier output is connected to a data output circuit 26 to provide read data as the output data of the resistive memory device 10. To write data to the memory array 12, the column selector circuit 22 connects the bit lines to a write driver circuit 30 which is configured to receive write data. In practice, the write driver circuit 30 and the sense amplifier circuit 24 includes a bank of write drivers and a bank of sense amplifiers, one set of write driver and one set of sense amplifier for each input/output (I/O) of the flash memory device. Each set of write driver and sense amplifier is coupled to a block of memory cells 14 in the cell array 12. For example, when the resistive memory device 10 generates output data in K-bit (i.e. K-bit I/O), the write driver circuit 30 and the sense amplifier circuit 24 may include K write drivers and K sense amplifiers, each write driver circuit and each sense amplifier circuit being coupled to a block of bits lines associated with a databit of the output data. A control circuit 35 controls the operation and the mode configuration of the resistive memory device 10. The memory architecture shown in FIG. 1 is illustrative only and it will be appreciated that the structure and methods described herein may be utilized in other memory architectures.

Figure 2:
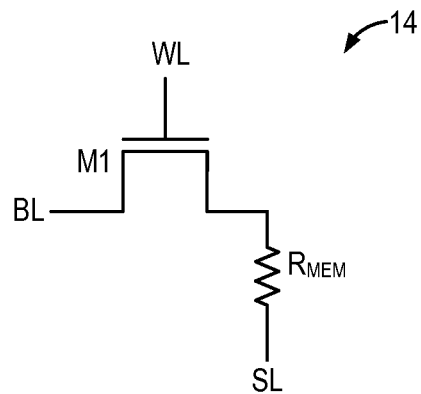
FIG. 2 is a schematic diagram of a resistive memory cell in the resistive memory device in some examples of the present invention.

In the present embodiment, resistive memory cells 14 are implemented using a metal-controllable-resistor-metal structure where the controllable resistor material as the resistive memory element is formed between upper and lower conductive electrodes. The controllable resistor material has variable resistance and can be programmed to a high resistance state or a low resistance state. FIG. 2 is a schematic diagram of a resistive memory cell in the resistive memory device in some examples of the present invention. Referring to FIG. 2, a resistive memory cell 14 includes a resistive memory element denoted as a resistor $R_{MEM}$ connected in series with a switching device M1 acting as a cell selector. In the present example, the switching device M1 is an NMOS transistor. The drain terminal of the cell selector transistor M1 is coupled to the bit line BL, the gate terminal of the cell selector transistor M1 is coupled to the word line WL. The resistive memory element $R_{MEM}$ is connected in series with the source terminal of the cell selector transistor M1. The other end of the resistive memory element $R_{MEM}$ is the source line SL of the cell array 12. In operation, the source line SL of the cell array may be connected to different voltage potential to facilitate the writing, reading and refreshing of the memory content. In some embodiments, the resistive memory element $R_{MEM}$ is formed using carbon nanotubes.

In some embodiments, the resistive memory cell may be configured to store a logical low value (logical "0") by programming the resistive memory element to have a relatively large resistance ($R_{RESET}$). In the present description, the logical low or "0" state of the resistive memory cell may be referred to as a "reset" state. The resistive memory cell may also be configured to store a logical high value (logical "1") by programming the resistive memory element to have a relatively small resistance ($R_{SET}$). In the present description, the logical high or "1" state of the resistive memory cell may be referred to as a "set" state. Thus, the resistive memory element $R_{MEM}$ may have a large resistance value in the reset state and a small resistance value in the set state. It is understood that resistive memory cells may be constructed to operate in the opposite resistance states in other configurations of the resistive memory device. That is, the resistive memory element $R_{MEM}$ may have a small resistance value in the reset state and a large resistance value in the set state in other embodiments. In general, a resistive memory cell is said to be in a high resistance state when the memory cell has a large resistance value and a resistive memory cell is said to be in a low resistance state when the memory cell has a small resistance value. The high and low resistance states can be assigned to either of the logical low or logical high states.

To write data to a resistive memory cell, a word line is activated by the row address and a bit line is selected by the column selector in response to a column address. The write driver circuit 30 receives the input write data and generate a write pulse in response to the write data. The write pulse is coupled to the bit line BL of the memory cell. Meanwhile, the source line SL of the resistive memory cell is biased to a selected level in response to the write data. The resistive memory element of the selected resistive memory cell is then programmed to a specific resistance value in response to the write data. In particular, to write a logical low value (reset) to the resistive memory cell, a write pulse having a logical low value (e.g. ground) is provided to the bit line BL while the source line SL is biased to a positive voltage value. The resistive memory element is programmed to a high resistance state. On the other hand, to write a logical high value (set) to the resistive memory cell, a write pulse having a logical high value (e.g. the positive power supply voltage) is provided to the bit line BL while the source line SL is biased to the ground potential or a negative voltage value. The resistive memory element is programmed to a low resistance state.

To read data stored from a resistive memory cell, the programmed resistance value of a resistive memory cell can be determined by comparing the programmed resistance to a reference resistance. In practice, the resistance value of the resistive memory cell may be detected by measuring a cell current that flows through the resistive memory element when the cell selector transistor M1 is turned on. The cell current value is directly related to the programmed resistance value of the memory cell. More specifically, the cell current value is inversely proportional to the programmed resistance value of the memory cell. Accordingly, when the memory cell is programmed to a large resistance value (the reset state), the cell current is small. Meanwhile, when the memory cell is programmed to a small resistance value (the set state), the cell current is large. Thus, the programmed resistance value of a resistive memory cell can be determined by comparing the cell current to a reference current. In some embodiments, the cell current is used to develop a voltage at a sense node. The sense node voltage, being indicative of the cell current, is measured and compared to a reference voltage to determine the programmed resistance of the resistive memory cell.

Figure 3:
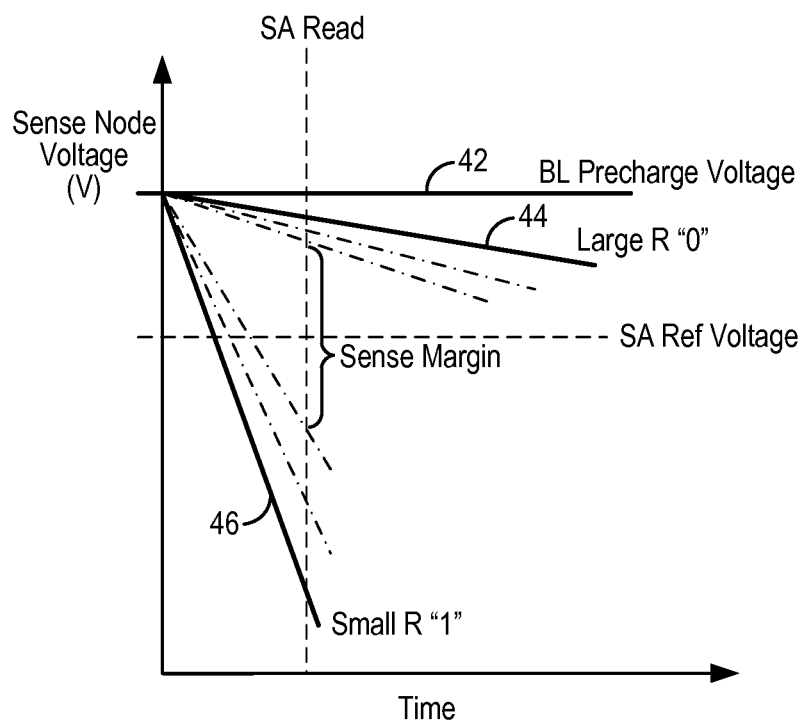
FIG. 3 is a plot of the sense node voltage of a resistive memory during the read operation in some example.
Figure 4:
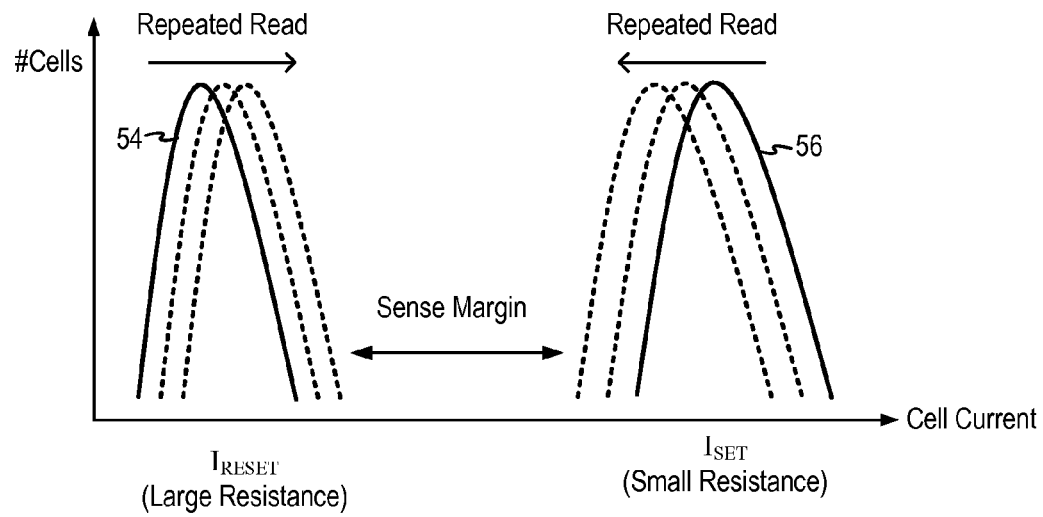
FIG. 4 is a plot of the cell current distribution for set and reset resistance values in a resistive memory cell in some example.

In one example, the read operation for a resistive memory cell will be described with reference to FIGS. 3 and 4. FIG. 3 is a plot of the sense node voltage of a resistive memory during the read operation in some example. FIG. 4 is a plot of the cell current distribution for set and reset resistance values in a resistive memory cell in some example. When a resistive memory cell is selected for read out, a bit line associated with the selected memory cell is selected by the column selector in response to the column address. The selected bit line is pre-charged to a precharge voltage level (curve 42). Meanwhile, the source line SL of the resistive memory cell is connected to the ground potential. Then, the word line is activated by the row address associated with the selected memory cell. The word line is activated to turn on the cell selector transistor M1. With the bit line (sense node) precharged to the precharge voltage level and the source line connected to the ground potential, a cell current flows through the resistive memory element $R_{MEM}$ where the cell current has a current value indicative of the programmed resistance of the resistive memory cell.

The bit line is connected to a sense node where the voltage on the bit line or at the sense node is sensed or measured. As a result of the cell current flowing through the resistive memory element $R_{MEM}$, the sense node voltage is discharged from the precharged voltage level (curve 42). In particular, the sense node voltage decreases at a rate indicative of the programmed resistance of the resistive memory cell. When the resistive memory cell is in the reset state with a large resistance value (curve 44), the cell current is small and the sense node voltage decreases slowly from the precharged voltage level. When the resistive memory cell is in the set state with a small resistance value (curve 46), the cell current is large and the sense node voltage decreases quickly from the precharged voltage level. The sense node voltage is allowed to develop for a given time duration and then the sense node voltage is read by a sense amplifier (SA) and compared with a reference voltage (SA Ref Voltage). When the sense node voltage is greater than the sense amplifier reference voltage, the resistive memory cell is in the reset state ("0"). When the sense node voltage is less than the sense amplifier reference voltage, the resistive memory cell is in the set state ("1"). The read out data is thus derived from the sense amplifier output comparing the sense node voltage to the reference voltage.

However, due to properties of the controllable resistor material being used as the resistive memory element and limitations in the fabrication process, the resistance values for the high and low resistance states are often distributed over a range and the resistance values may vary over time. Furthermore, repeated reading of the resistive memory cell may also cause the resistance values to drift. For example, when the resistive memory device is fabricated using scaled down feature size, it is increasingly difficult to fabricate resistive memory cells with uniform contact size. Thus, it is difficult to achieve a uniform write current across all the memory cells, which results in variations in the electrical characteristics of the memory cells, such as variation in the resistance values of the resistive memory element. The process variations and limitations leads to narrowing of the read sense margin of the memory cells. Narrowing of the read sense margin degrades performance and yield of the resistive memory device.

In order to read out the programmed resistance value from the memory cell accurately, a sufficiently large sense margin is needed to ensure detection of the logical high state and the logical low state. In the present description, the sense margin is defined as the distance between the reset resistance value and the set resistance value of the resistive memory cell, which can be represented by the distance between the cell current values or the sense node voltage values for the reset state and the set state. Referring to FIG. 4, in the ideal case, the cell current for the reset state ($I_{RESET}$) will have distribution centered around the desired reset current value as denoted by curve 54 while the cell current for the set state ($I_{SET}$) will have a distribution centered around the desired set current value as denoted by curve 56. The ideal reset cell current and the ideal set cell current have a sufficiently large current difference value to provide a sufficiently large sense margin between the set state and the reset state. However, due to fabrication process variations, limitations of the controllable resistor material, or repeated read operations, the reset and set programmed resistance values tend to drift from the ideal values over time. This is particularly problematic as the set and reset resistance values, or set and reset cell current values, tend to converge, reducing the sense margin which reduces the read data accuracy. Referring to FIG. 3, when the reset and set programmed resistance values converges, the sense node voltage values between the set state and the reset state also converge, reducing the available sense margin and reducing the read data accuracy.

In embodiments of the present invention, a resistive memory device implements the memory cell parallel merging scheme to guarantee a sufficient read sense margin to distinguish between the logical "0" value and the logical "1" value. In particular, it is desirable to increase the current difference between the reset cell current and the set cell current to ensure a sufficient read sense margin. In the present description, merging of two or more resistive memory cells refers to combining two or more physically separate resistive memory cells in parallel in operation so that the "merged memory cell" behaves functionally as a single memory cell but are in fact two or more physically separate memory cells. In embodiments of the present invention, two or more memory cells are merged in parallel in operation to increase the sense margin and the read accuracy of the memory cells.

Figure 5:
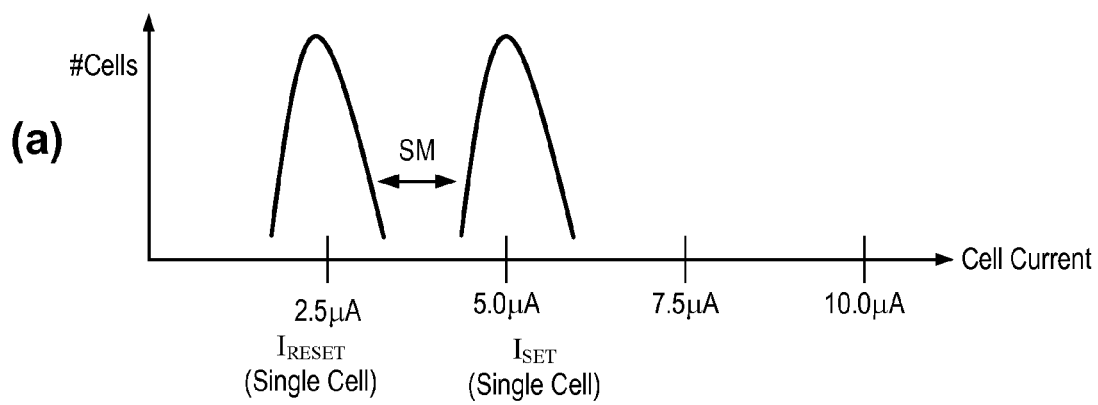
FIG. 5, which includes
Figure 5:
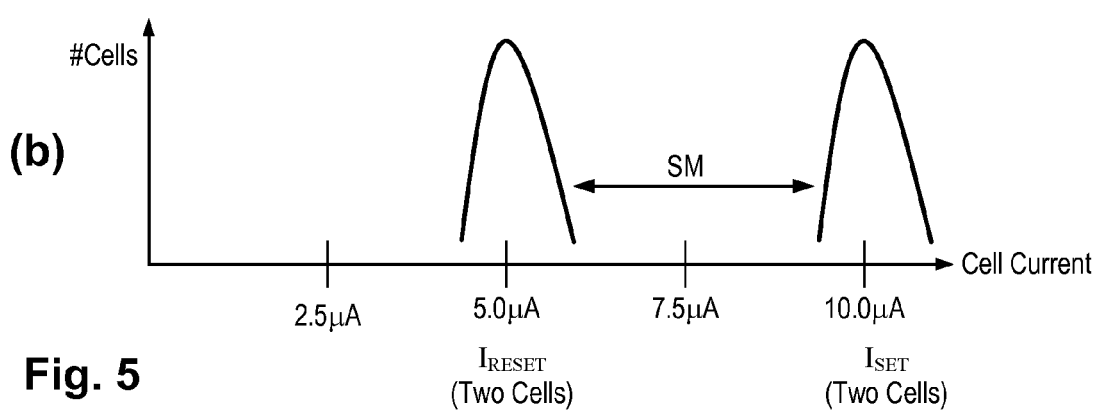

FIG. 5, which includes FIGS. 5(a) and 5(b), illustrates the cell current distribution of a single resistive memory cell and a merged resistive memory cell in a resistive memory device in some examples. Referring to FIG. 5(a), in a resistive memory device of the present example, the reset current for the resistive memory cell is designed to be around 2.5 μA and the set current for the resistive memory cell is designed to be around 5.0 μA. The sense margin (SM) between the set and reset state is about 2.5 μA. However, when two of the resistive memory cells are merged in parallel, the effective resistance of the merged memory cell is reduced by half and the cell current doubles. Thus, the current difference between the reset state and the set state doubles. By using a merged memory cell, the effective sense margin of the resistive memory cell is increased. Referring to FIG. 5(b), when two physically separate memory cells are merged in parallel, the merged memory cell has a reset current of 5.0 μA and a set current of 10 μA. A sense margin of 5 μA is achieved to guarantee accurate detection of the logical high state and the logical low state in the memory cell. The sense margin of the merged memory cell is double that of the single memory cell. Merging of two or more memory cells in operation also alleviates sense margin degradation that is caused by resistance value distributions due to fabrication process variations.

Figure 6:
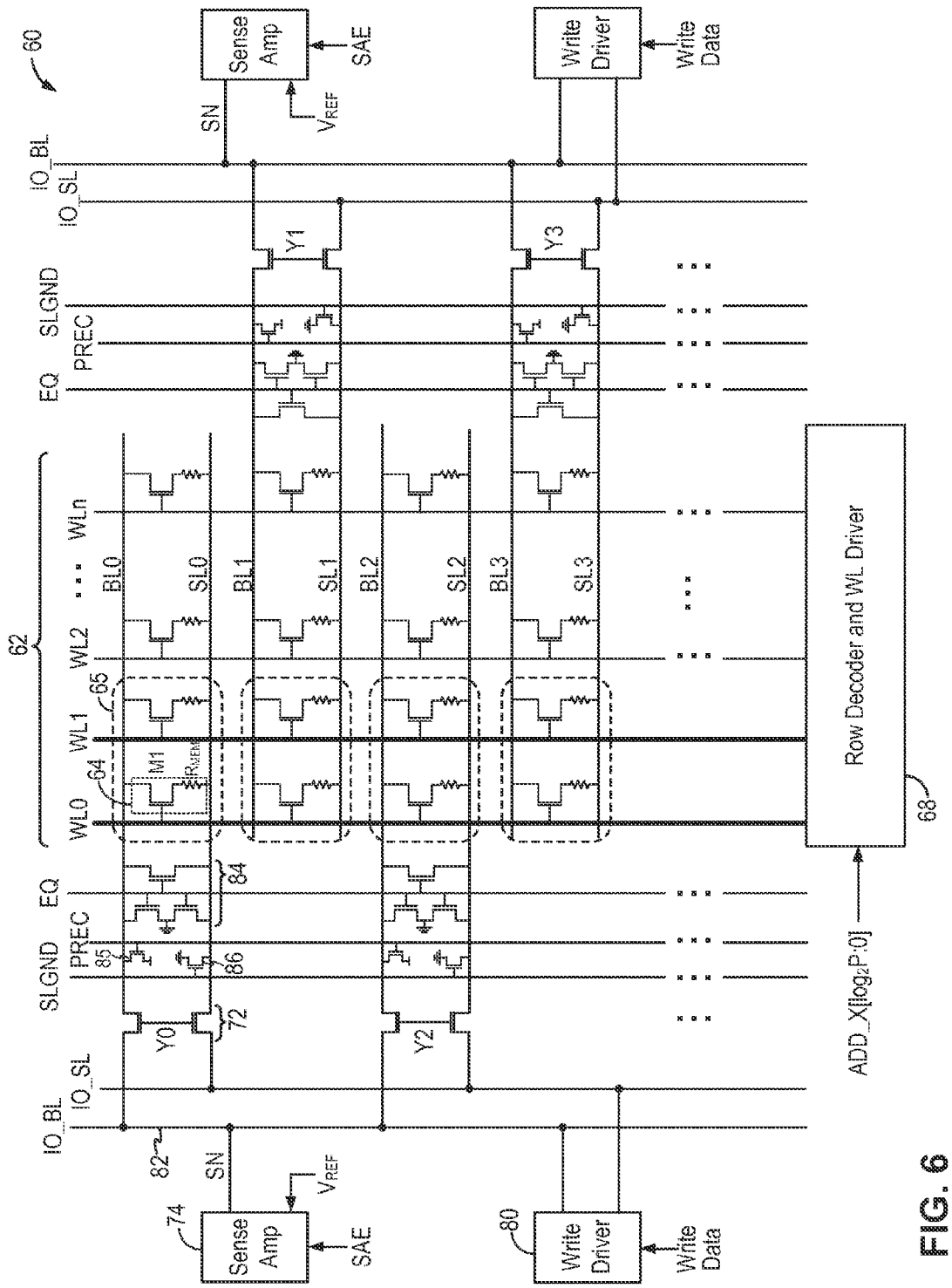
FIG. 6 is a schematic diagram of a resistive memory device illustrating the memory cell parallel merging scheme in embodiments of the present invention.

FIG. 6 is a schematic diagram of a resistive memory device illustrating the memory cell parallel merging scheme in embodiments of the present invention. Referring to FIG. 6, a resistive memory device 60 includes a two-dimensional array 62 of resistive memory cells 64. Each resistive memory cell 64 includes a cell selector transistor M1 connected in series with a resistive memory element $R_{MEM}$. The cell selector transistor M1 has a control terminal controlled by a respective word line WL, a drain terminal connected to a respective BL, and a source terminal connected to the resistor $R_{MEM}$. The other terminal of the resistor $R_{MEM}$ is connected to a respective source line SL. The word lines are controlled by the row decoder and word line driver 68. In the present illustration, resistive memory cells connected to the same word line (e.g. WL0, WL1, WL2 . . . ) form a row in the memory array. Meanwhile, resistive memory cells connected to the same bit line (e.g. BL0, BL1, BL2 . . . ) and the same source line (e.g. SL0, SL1, SL2 . . . ) form a column in the memory array.

The memory array 62 includes equalizer transistors 84 controlled by an equalization signal EQ to equalize a pair of bit line and source line. The memory array 62 further includes a precharge transistor 85 controlled by the precharge signal PREC to precharge the bit line to a positive voltage value. The memory array 62 further includes a source line transistor 86 controlled by the source line ground signal SLGND to ground the respective source line. A pair of column selector transistors 72 connects to the bit line and the source line of each column of memory cells and are controlled by a respective column select signal Yx (e.g. Y0, Y1, Y2, . . . ). The column selector transistors 71 connect the bit line BL to a bit line input-output bus (IO_BL) which also serves as the sense node 82. The column selector transistors 71 connect the source line SL to a source line input-output bus (IO_SL). The sense node 82 is connected to a sense amplifier 74 where the sense node voltage is compared with a sense reference voltage $V_{REF}$. A write driver 80 is coupled to drive the bit line input-output bus (IO_BL) and the source line input-output bus (IO_SL) for writing to the memory cell.

In embodiments of the present invention, two individual resistive memory cells in the same column (same bit line BLx and same source line SLx) are merged in parallel in operation. For example, the resistive memory cells associated with word line WL0 and word line WL1 are merged in each column, as shown by the dotted line box 65 in FIG. 6. In some embodiments, merging of two resistive memory cells is realized by selecting the two cells in parallel, such as by enabling two word lines WL0 and WL1 simultaneously. Because the resistive memory cells in the same column are connected to the same bit line and the same source line, the resistive memory cells are connected in parallel when the two associated word lines are activated simultaneously. In the present illustration, two resistive memory cells in two adjacent word lines are merged in parallel. In other embodiments, two or more resistive memory cells can be merged in parallel. Furthermore, in other embodiments, two or more resistive memory cells from adjacent or nonadjacent memory cells may be selected for merging. It is not necessary to select two neighboring or adjacent memory cells for merging.

In some embodiments, two or more memory cells are selected to be merged by ignoring one or more bits of the row address (or X-address). When one or more bits of the row address are ignored, two or more word lines WLx will become enabled.

With two memory cells thus selected to be merged, the merged memory cell 65 will be written to at the same time and read from at the same time. For example, the write driver 80 provides the write bias voltages to the bit line input-output bus (IO_BL) and the source line input-output bus (IO_SL) based on the write data. The column selector transistors 72 are enabled and the same write data is written into the merged memory cell 65. To read data from the merged memory cell 65, the word lines WL0 and WL1 are enabled simultaneously so that the resistive memory elements $R_{MEM}$ in the cells become connected in parallel, reducing the cell resistance and increasing the sense margin.

The memory cell parallel merging scheme of the present invention necessitates a tradeoff between increasing read sense margin and array usage consumption. The unit bit area increases when multiple memory cells are merged into one memory cell to increase the sense margin. In some situation, the memory cell parallel merging scheme can be applied when the memory cell density is not critical and a lower memory capacity for the resistive memory device can be tolerated. In other situation, the memory cell parallel merging scheme can be applied only for sensitive data, such as for storing error correction code databits, where reduced error rate is desired.

Figure 8:
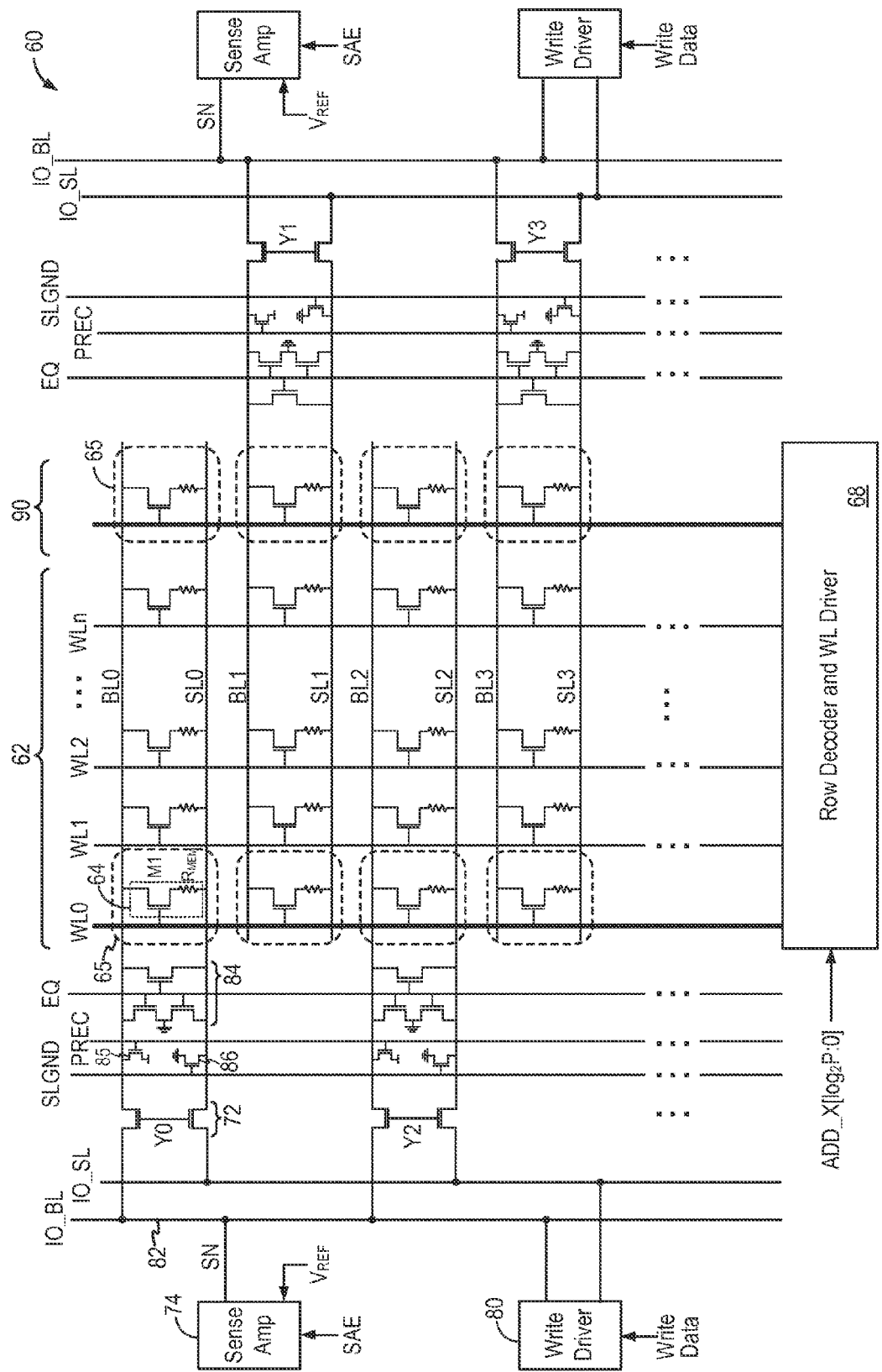
FIG. 8 is a schematic diagram of a resistive memory device illustrating the memory cell parallel merging scheme in an alternate embodiment of the present invention.

In alternate embodiments, the resistive memory device may include an array 90 of redundant memory cells in the memory array, as shown in FIG. 8. The memory cell parallel merging scheme is applied to merge a redundant memory cell with a memory cell in the array that have become degraded or is malfunctioning, as shown by dotted line box 65, thereby forming a merged memory cell.

Figure 7:
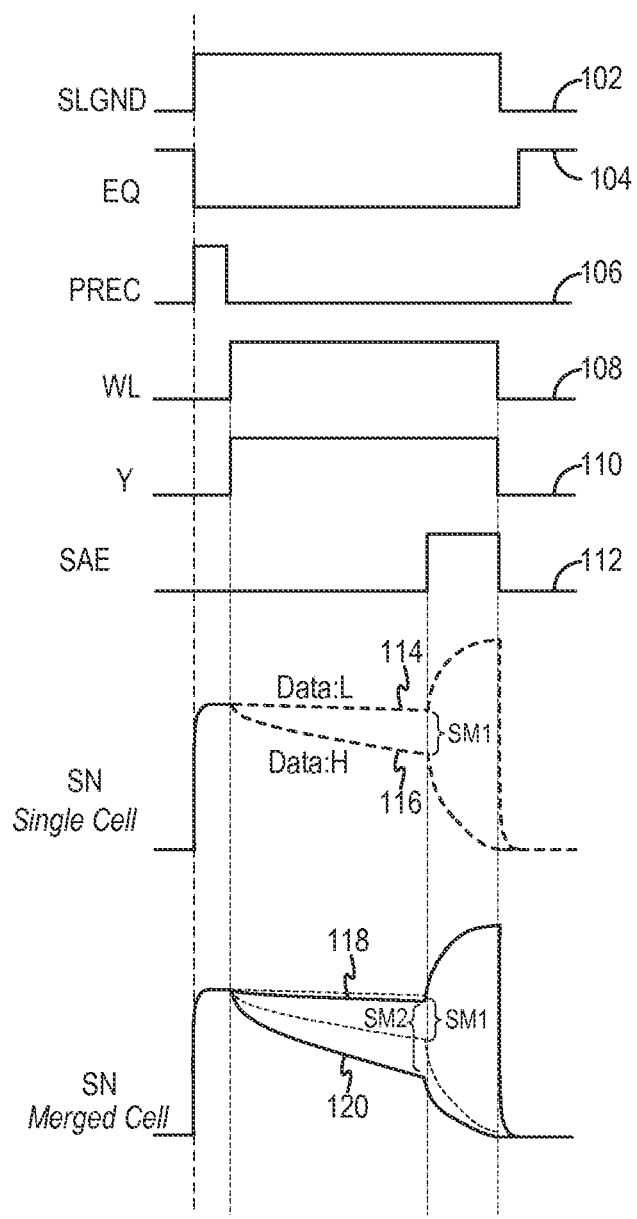
FIG. 7 is a timing diagram illustrating the read operation of the resistive memory device using merged memory cell in some examples.

FIG. 7 is a timing diagram illustrating the read operation of the resistive memory device using merged memory cell in some examples. Referring to FIG. 7, when a read operation is initiated, the source line SL is grounded. Thus, the source line ground signal SLGND (curve 102) is enabled (logical high) to turn on the source line transistor 86. Meanwhile, the equalization signal EQ (curve 104) is disabled to turn off the equalization transistors 84 and free the bit line BL and the source line SL from being equalized. Then, a precharge pulse is applied to the precharge signal PREC (curve 106) to precharge the bit line to a positive voltage. With the bit line BL precharged, the word line WL (curve 108) and the column selector signal Y (curve 110) are enabled to select the desired column of memory cells.

With the word line WL and the column selector signal Y being selected, a sense node voltage develops at the sense node 82. When the resistive memory cell 64 is in a reset state (logical "0" or "L"), the programmed resistance is high and the voltage at the sense node does not decrease very much, as shown by curve 114. The sense node voltage almost maintains its precharged voltage level. When the resistive memory cell 64 is in a set state (logical "1" or "H"), the programmed resistance is low and the voltage at the sense node decrease quickly, as shown by curve 116. After a given time duration to develop the sense node voltage, the sense amplifier enable signal SAE (curve 112) is enabled and the sense node voltage is read by the sense amplifier. In the case of normal operation with a single resistive memory cell, a sense margin of SM1 is achieved when the sense amplifier enable signal SAE is activated. In the case of a merged memory cell, such as merging of two memory cells, the cell resistance of the reset state is reduced but remains sufficiently large so that the sense node voltage does not decrease very much, as shown by curve 118. However, in the merged memory cell, the cell resistance for the set state becomes halved and the sense node voltage decreases more rapidly, as shown by curve 120. A sense margin of SM2 is achieved when the sense amplifier enable signal SAE is activated. When a merged memory cell is used, a sense margin SM2 of at least twice the sense margin SM1 can be achieved.

In the above described embodiments, the sense amplifier compares the sense node voltage to a reference voltage. In other embodiments, the sense amplifier may be configure to compare a current at the sense node with a reference current level.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A resistive memory device, comprising:
   a two-dimensional array of resistive memory cells, each memory cell including a resistive memory element connected in series with a cell selector transistor, each memory cell being accessed by a word line, a bit line and a source line, wherein the resistive memory cells sharing a common word line form a row of the array and the resistive memory cells sharing a common bit line and a common source line form a column of the array;
   a write driver configured to apply write bias voltages to the bit line and the source line to write data to one or more resistive memory cells in the array selected for access, the write bias voltages being applied to program a resistance of the resistive memory element of each of the one or more selected resistive memory cells in response to the write data; and
   a sense amplifier configured to sense a signal difference between a reference signal and a sense node signal and to generate an output signal indicative of the signal difference, the sense node signal being related to a programmed resistance of the resistive memory elements of the one or more resistive memory cells in the array selected for access,
   wherein two or more memory cells in a column of the two-dimensional array sharing the same bit line and the same source line are configured to operate by its own word line in parallel as a merged memory cell, the write driver being configured to program the resistance of the resistive memory element of each of the two or more resistive memory cells in the merged memory cell simultaneously, and the sense amplifier being configured to read the programmed resistance of the resistive memory element of each of the two or more resistive memory cells in the merged memory cell simultaneously.

2. The resistive memory device of claim 1, wherein the two or more memory cells are configured to operate in parallel as the merged memory cell by activating simultaneously the associated two or more word lines for the two or more memory cells.

3. The resistive memory device of claim 2, further comprises:
   a row decoder configured to receive a row address for accessing one or more memory cells in the array, each row address activating one word line,
   wherein the row decoder is configured to ignore one or more bits of the row address to access the two or more word lines of the merged memory cells simultaneously.

4. The resistive memory device of claim 1, wherein the merge memory cell is configured to store databits associated with an error correction code.

5. The resistive memory device of claim 1, wherein the array of memory cells includes an array of redundant memory cells, and the merged memory cell including two or more memory cells being configured to operate in parallel includes at least one redundant memory cell.

6. The resistive memory device of claim 1, wherein the two or more memory cells configured to operate in parallel as the merged memory cell comprise neighboring memory cells in a column of the array.

7. The resistive memory device of claim 1, wherein the two or more memory cells configured to operate in parallel as the merged memory cell comprise nonneighboring memory cells in a column of the array.

8. The resistive memory device of claim 1, wherein the merged memory cell has an effective programmed resistance less than the programmed resistance of one of the resistive memory cell, and the merged memory cell has an effective sense margin greater than the sense margin of one of the resistive memory cell.

9. The resistive memory device of claim 1, wherein the sense node signal comprises a voltage signal.

10. A method in a resistive memory device, the resistive memory device including a two-dimensional array of resistive memory cells, each memory cell including a resistive memory element connected in series with a cell selector transistor, each memory cell being accessed by a word line, a bit line and a source line, wherein the resistive memory cells sharing a common word line form a row of the array and the resistive memory cells sharing a common bit line and a common source line form a column of the array, the method comprising:
   configuring two or more memory cells in a column of the two-dimensional array sharing the same bit line and the same source line to operate by its own word line in parallel as a merged memory cell;
   programming the resistance of the resistive memory element of each of memory cells in the merged memory cell in response to the write data, the resistance of the resistive memory element of each of the two or more resistive memory cells in the merged memory cell being programmed simultaneously; and
   reading the programmed resistance value of the resistive memory element of each of memory cells in the merged memory cell, the programmed resistance of the resistive memory element of each of the two or more memory cells in the merged memory cell being read simultaneously.

11. The method of claim 10, wherein configuring two or more memory cells in a column of the array to operate in parallel as a merged memory cell comprises:
   activating simultaneously the associated two or more word lines for the two or more memory cells.

12. The method of claim 10, wherein configuring two or more memory cells in a column of the array to operate in parallel as a merged memory cell comprises:
   ignore one or more bits of the row address to access the two or more word lines of the merged memory cells simultaneously.

13. The method of claim 10, further comprising:
   storing databits associated with an error correction code in the merge memory cell.

14. The method of claim 10, wherein configuring two or more memory cells in a column of the array to operate in parallel as a merged memory cell comprises:
   configuring two or more memory cells in a column of the array to operate in parallel as a merged memory cell, at least one of the two or more memory cells being a redundant memory cell.

15. The method of claim 10, wherein configuring two or more memory cells in a column of the array to operate in parallel as a merged memory cell comprises:

configuring two or more neighboring memory cells in a column of the array as the merged memory cell.

16. The method of claim 10, wherein configuring two or more memory cells in a column of the array to operate in parallel as a merged memory cell comprises:

configuring two or more nonneighboring memory cells in a column of the array as the merged memory cell.

17. The method of claim 10, wherein the merged memory cell has an effective programmed resistance less than the programmed resistance of one of the resistive memory cell, and the merged memory cell has an effective sense margin greater than the sense margin of one of the resistive memory cell.

18. The method of claim 10, wherein reading the programmed resistance value of the merged memory cell further comprises:

sense a signal difference between a reference signal and a sense node signal using a sense amplifier, the sense node signal being related to a programmed resistance of the merged memory cell; and generating an output signal indicative of the signal difference.

19. The method of claim 18, wherein the sense node signal comprises a voltage signal.

* * * * *